(12) United States Patent
Kim et al.

(10) Patent No.: US 7,354,846 B2
(45) Date of Patent: Apr. 8, 2008

(54) SUBMOUNT SUBSTRATE FOR MOUNTING LIGHT EMITTING DEVICE AND METHOD OF FABRICATING THE SAME

(75) Inventors: Geun Ho Kim, Seoul (KR); Chil Keun Park, Yongin-si (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 11/633,613

(22) Filed: Dec. 5, 2006

(65) Prior Publication Data

US 2007/0080420 A1    Apr. 12, 2007

Related U.S. Application Data

(62) Division of application No. 11/174,640, filed on Jul. 6, 2005.

(30) Foreign Application Priority Data

Jul. 6, 2004    (KR)    ......................... 10-2004-053640

(51) Int. Cl.
*H01L 21/22*    (2006.01)
*H01L 21/38*    (2006.01)

(52) U.S. Cl. ............... 438/555; 438/942; 257/E33.006; 257/E33.062

(58) Field of Classification Search ............... 438/555, 438/942; 257/E33.006, E33.062
See application file for complete search history.

(56) References Cited

U.S. PATENT DOCUMENTS

| 6,492,685 | B1 | 12/2002 | Koyama et al. | ............ 257/351 |
| 7,229,859 | B2 * | 6/2007 | Yudasaka et al. | ............ 438/149 |
| 2004/0206970 | A1 | 10/2004 | Martin | ........................ 257/98 |
| 2006/0091403 | A1 | 5/2006 | Chang et al. | .................. 257/79 |
| 2006/0175621 | A1 | 8/2006 | Ohtsuka et al. | ............... 257/88 |

* cited by examiner

*Primary Examiner*—Ngân V. Ngô
(74) *Attorney, Agent, or Firm*—Ked & Associates, LLP

(57) ABSTRACT

A submount substrate for mounting a light emitting device and a method of fabricating the same, wherein since a submount substrate for mouthing a light emitting device in which a Zener diode device is integrated can be fabricated by means of a silicon bulk micromachining process without using a diffusion mask, some steps of processes related to the diffusion mask can be eliminated to reduce the manufacturing costs, and wherein since a light emitting device can be flip-chip bonded directly to a submount substrate for a light emitting device in which a Zener diode device is integrated, a process of packaging the light emitting device and the voltage regulator device can be simplified.

10 Claims, 16 Drawing Sheets

SUBMOUNT SUBSTRATE FOR MOUNTING LIGHT EMITTING DEVICE AND METHOD OF FABRICATING THE SAME

CROSS-REFERENCE TO RELATED APPLICATIONS

This application is a Divisional Application of prior U.S. patent application Ser. No. 11/174,640 filed Jul. 6, 2005, which claims priority under 35 U.S.C. §119 to Korean Application No. 10-2004-0053640 filed on Jul. 9, 2004, whose entire disclosure is hereby incorporated by reference.

BACKGROUND

1. Field of the Invention

The present invention relates to a submount substrate for mounting a light emitting device in which a Zener diode used as a voltage regulator device is integrated, and a method of fabricating the same. More particularly, the present invention relates to a submount substrate for mounting a light emitting device in which a PN Zener diode or a Zener diode having a bi-directional threshold voltage characteristic is integrated using a silicon bulk micromachining process, and a method of fabricating the same.

2. Description of the Related Art

In general, a light emitting device such as a light emitting diode or a laser diode using a group III to V compound semiconductor material of a direct transition type semiconductor can generate a variety of colored lights including green, blue, ultraviolet and the like as a result of due to the advancement in the field of thin film growth technologies and semiconductor materials.

Furthermore, a white light with good efficiency can also be embodied by using a fluorescence material or combining a variety of colors.

The technological advancement thus described enables the light emitting device to encompass a wide range of applications such as a transmission module for optical-communication system, a light emitting diode (LED) back-light capable of substituting for the cold cathode fluorescence lamp (CCFL) constituting the backlight of a liquid crystal display (LCD) device, a white LED system capable of substituting for a fluorescent lamp or incandescent lamp, and a traffic light, in addition to a display device.

FIG. 1 is a cross-sectional view of a general LED device. In order to fabricate this LED device, a buffer layer (102), an n-contact layer (103), an n-cladding layer (not shown), an active layer (104), a p-cladding layer (not shown), and a p-contact layer (105) are sequentially deposited on the top of a substrate (101) made of sapphire, n-GaAs, GaN or the like, using a chemical vapor deposition process.

Thereafter, a mesa etching is carried out to expose the n-contact layer (103), through a photolithographic etching process and a dry/wet etching process.

Next, on the top of the p-contact layer (105) is formed a current diffusion layer (106), which is formed of a transparent electrode with good light transmission. For an electrical connection with an external circuit, a p-electrode (107-*p*) and an n-electrode (107-*n*) are formed on the current diffusion layer (106) and the n-contact layer (103), respectively, thereby forming a LED device (100).

In other words, when a voltage from an external circuit is applied between the p-electrode (107-*p*) and the n-electrode (107-*n*) in the light-emitting device, positive holes and electrons are injected into the p-electrode (107-*p*) and the n-electrode (107-*n*). While the positive holes and the electrons are recombined in the active layer (104), extra energy is converted into light, which in turn is emitted to the outside through the current diffusion layer and the substrate.

In the meantime, if static electricity or surge voltage is produced in this type of light emitting device, an excessive electric charge flows into the semiconductor layers and finally causes failure of the light emitting device.

This problem becomes worse in a case where the devices are fabricated on the top of a dielectric substrate. When the surge voltage is produced in the device, an applied voltage may rise up to a few thousands volts. Thus, when a light emitting device has a low withstand voltage (allowable voltage), an additional protective device should be installed.

As a protective device, for example, a plurality of general diodes are connected in series such that the diodes can be turned on at a voltage higher than the driving voltage of the light emitting device.

Therefore, as shown in FIGS. 2*a* and 2*b*, a PN or PNP (NPN) Zener diode (200. 300), which is used as a constant voltage device, is connected to a light emitting device (100) in such a manner that their opposite electrodes are connected to each other. Thus, the voltage applied to the light emitting device is restricted to Vz (Zener voltage) of the Zener diode.

If the reverse voltage of the Zener diode is equal to or greater than Vz, the reverse current (a current flowing from the n-electrode towards the p-electrode) increases and the terminal voltage between both ends of the Zener diode remains almost constant, i.e. Vz.

In this way, a Zener diode is not only used as a protective device but also widely used as a voltage regulator device for maintaining a load voltage to be constant against variation in an input voltage or in a load.

Such a Zener diode as a protective device is fabricated separately from the device, such as a light emitting device, to be protected and is then electrically connected thereto in parallel. Alternatively, the light emitting device and the Zener diode may be connected on a silicon submount substrate by means of a flip chip bonding.

FIGS. 3*a* to 3*g* are cross-sectional views explaining a process of fabricating a conventional PN Zener diode. FIGS. 3*a* and 3*b* show a process of forming masks.

First, a Zener diode is a device that utilizes the tunneling effect in quantum mechanics, and thus, a substrate (201) with low resistance must be used. Since Zener voltage (Vz) of the device is determined by the electrical resistivity of the substrate and the concentration of diffused impurities thereof, a substrate with an appropriate concentration of impurities contained therein must be used (see FIG. 3*a*).

Further, in order to selectively diffuse impurities into the substrate, a diffusion mask (202) (a silicon oxide film generally employed) is deposited on the top and bottom surfaces of the substrate. Then, the diffusion mask deposited on the top surface of the substrate is selectively etched and then patterned (see FIG. 3*b*).

FIG. 3*c* shows a diffusion step. After patterning the diffusion mask, a diffusion process is carried out. Impurities different from those in the substrate are injected into the substrate through a portion (portion "B" of FIG. 3C) where the diffusion mask is etched. The impurity injection process can utilize a diffusion process and an ion injection process using a furnace.

Here, impurities are not injected into the substrate through a portion "A" where the diffusion mask remains, because the impurities are covered by the diffusion mask.

Thereafter, the diffusion mask is removed (see FIG. 3*d*), and a protective film (203) is deposited on the top surface of the substrate (201). Then, the diffusion area D of the substrate (201) is exposed (see FIG. 3e).

Finally, as shown in FIGS. 3f and 3g, on the top surface of the exposed diffusion area (D) of the substrate (201) is formed an electrode (204-f), and on the bottom surface of the substrate (201) is formed an electrode (204-b). Consequently, a Zener diode (200) is fabricated.

As described above, the Zener diode according to the prior arts requires several processes such as a diffusion mask deposition process, a diffusion mask photo process and a diffusion mask etching process. Accordingly, there is a problem in that manufacturing costs can not be reduced due to increased the number of manufacturing processes.

SUMMARY OF THE INVENTION

The present invention is conceived to solve the aforementioned problem. Accordingly, an object of the present invention is to provide a submount substrate for mounting a light emitting device and a method of fabricating the same, wherein the submount substrate for mounting the light emitting device in which a Zener diode device is integrated can be fabricated by means of a silicon bulk micromachining process without using a diffusion mask, thereby reducing processes related to the diffusion mask and thus reducing manufacturing costs.

Another object of the present invention is to provide a submount substrate for mounting a light emitting device and a method of fabricating the same, wherein a process of packaging the light emitting device and a voltage regulator device can be simplified by flip-chip bonding the light emitting device directly to the submount substrate for the light emitting device in which a Zener diode device is integrated.

According to a first aspect of the present invention for achieving the objects, there is provided a submount substrate for mounting a light emitting device, comprising: a substrate doped with first polar impurities; a first diffusion layer formed by causing second polar impurities having the polarity different from that of the first polar impurities to be injected and diffused into the substrate, and then divided into two parts by means of a substrate region with no diffusion region formed thereon; an insulating layer formed on a top surface of the substrate and having a first opening through which a part of one divided region of the first diffusion layer is exposed and a second opening through which a part of the substrate region with no diffusion region formed thereon is exposed; a first electrode line formed on a top surface of the insulating layer and connected to the first diffusion layer through the first opening; and a second electrode line connected to the substrate region through the second opening.

According to a second aspect of the present invention for achieving the objects, there is provided a submount substrate for mounting a light emitting device, comprising: a substrate doped with first polar impurities; a first diffusion layer formed by causing second polar impurities having the polarity different from that of the first polar impurities to be injected and diffused into the substrate and then divided into two parts by a first region with no diffusion region formed thereon, each divided diffusion layer being divided into two parts by a second region with no diffusion region formed thereon; an insulating layer formed on a top surface of the substrate and having first and second openings through which the first diffusion layer formed between the first and second regions is exposed; a first electrode line formed on the insulating layer and connected to the first diffusion layer through the first opening; and a second electrode line connected to the substrate region through the second opening.

According to a third aspect of the present invention for achieving the objects, there is provided a method of fabricating a submount substrate for mounting a light emitting device, comprising the steps of: preparing a substrate doped with first polar impurities; injecting and diffusing second polar impurities having the polarity different from that of the first polar impurities into top and bottom surfaces of the substrate to form first and second diffusion layers; forming a mask layer on the top surface of the substrate such that a part of the first diffusion layer is exposed therethrough; etching the exposed first diffusion layer and the substrate to form a groove, and then removing the mask layer; forming an insulating layer on the groove and the first diffusion layer exposed by removing the mask layer therefrom; etching the insulating layer formed on the first diffusion layer and the groove to form a first contact region through which the first diffusion layer is exposed and a second contact region through which the substrate is exposed; and forming a first electrode line connected to the first diffusion layer through the first contact region and a second electrode line connected to the substrate through the second contact region.

According to a fourth aspect of the present invention for achieving the objects, there is provided a method of fabricating a submount substrate for mounting a light emitting device, comprising the steps of: preparing a substrate doped with first polar impurities; injecting and diffusing second polar impurities having the polarity different from that of the first polar impurities into top and bottom surfaces of the substrate to form first and second diffusion layers; forming mask layers, respectively, on the top and bottom surfaces of the substrate, removing part of the mask layer formed on the top surface of the substrate to form a first region to which a light emitting diode is bonded and second regions each of which is spaced apart from the first region in an opposite lateral direction of the substrate to separate the diffusion layer, and then removing the mask layer formed on the top surface of the substrate; etching the first diffusion layer and the substrate in the first and second regions; forming an insulating layer on the substrate including the etched regions; etching the insulating layer between the first and second regions to form first and second contact regions through which the first diffusion layer is exposed; and forming a first electrode line connected to the first diffusion layer through the first contact region and a second electrode line connected to the substrate through the second contact region.

BRIEF DESCRIPTION OF THE DRAWINGS

The above and other objects, features and advantages of the present invention will become apparent from the following descriptions of preferred embodiments given in conjunction with the accompanying drawings, in which.

DETAILED DESCRIPTION OF THE INVENTION

Hereinafter, the present invention will be described in detail with reference to preferred embodiments given in conjunction with the accompanying drawings.

FIGS. 4a to 4g are cross-sectional views illustrating a method of fabricating a submount substrate for mounting a light emitting device according to a first embodiment of the present invention, and show a process of fabricating the submount substrate for mounting the light emitting device in which a Zener diode capable of protecting a light emitting device from a surge voltage or static electricity is integrated, using a silicon bulk micromachining process.

Figure 1:
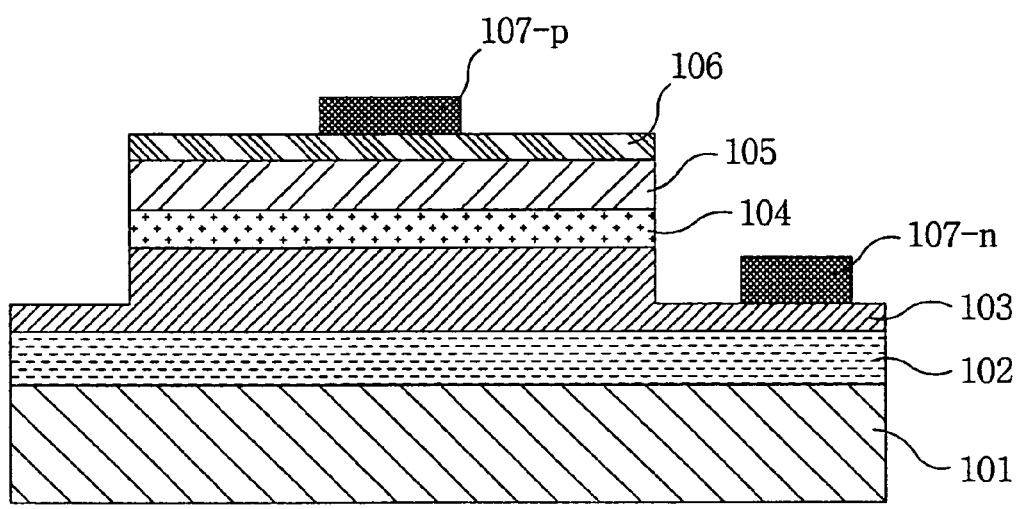
FIG. 1 is a cross-sectional view of a general light emitting diode.
Figure 2A:
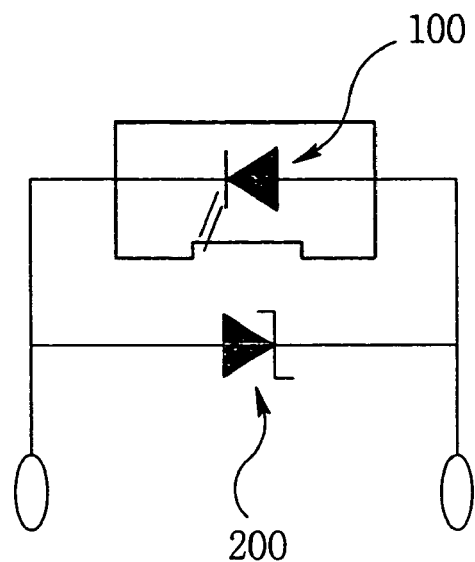
FIGS. 2a and 2b are equivalent circuit diagrams of a light emitting device and a voltage regulator device.
Figure 2B:
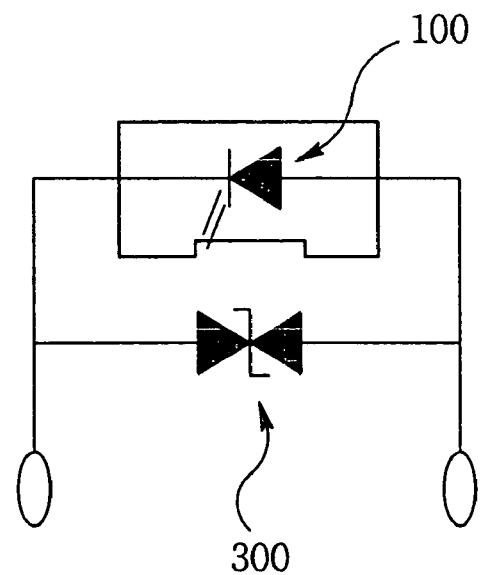
Figure 3A:
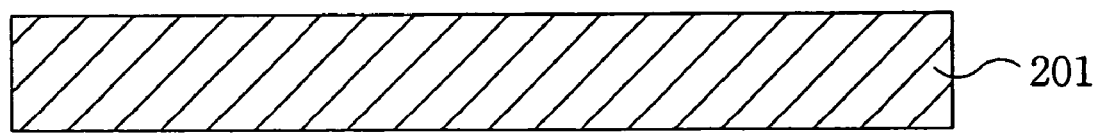
FIGS. 3a to 3g are cross-sectional views illustrating a method of fabricating a conventional PN Zener diode.
Figure 3B:
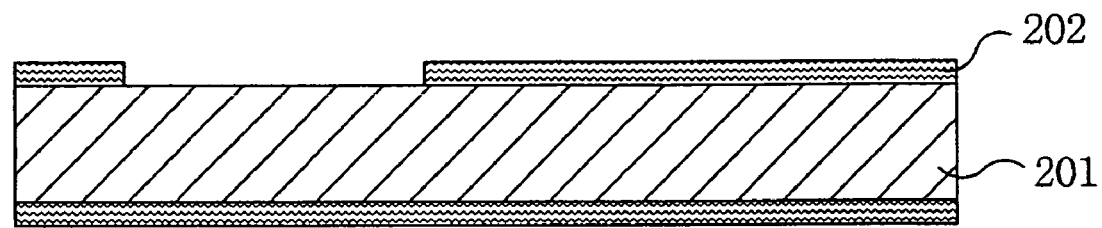
Figure 3C:
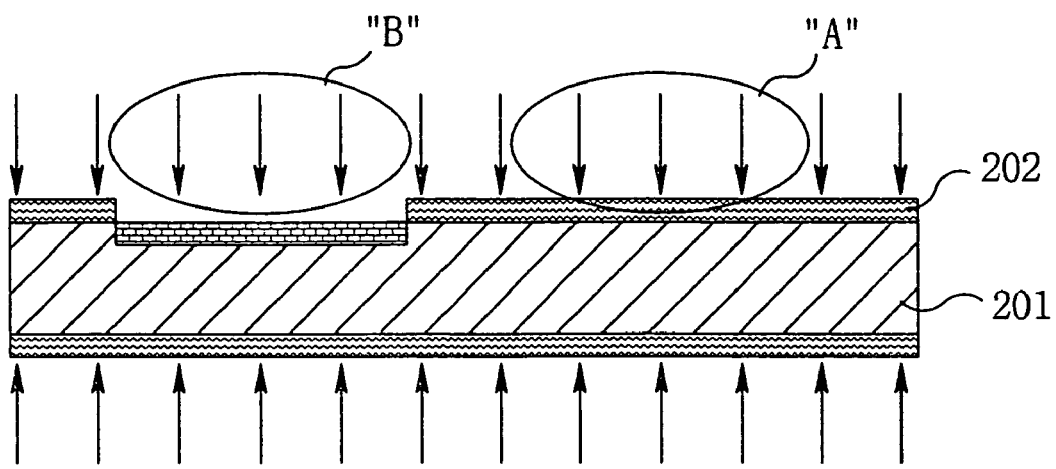
Figure 3D:
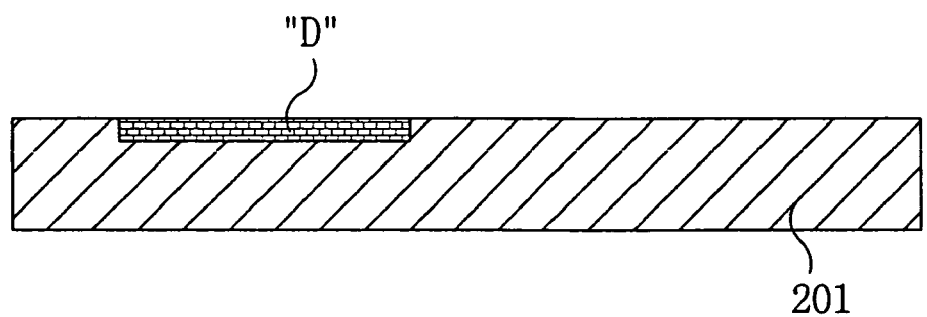
Figure 3E:
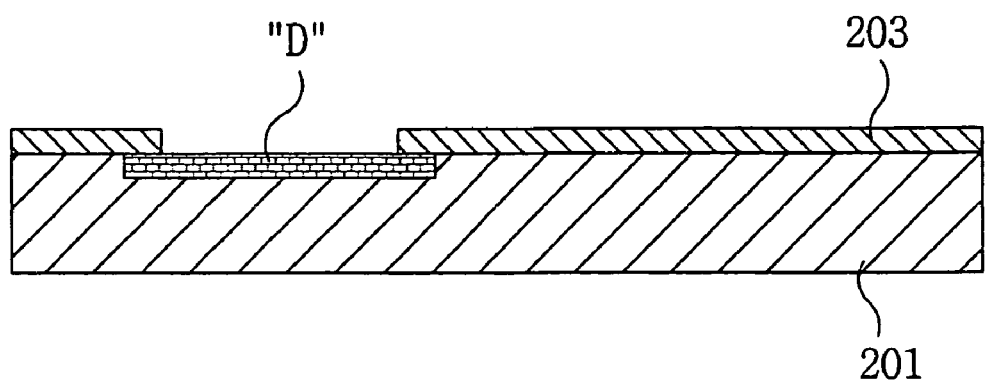
Figure 3F:
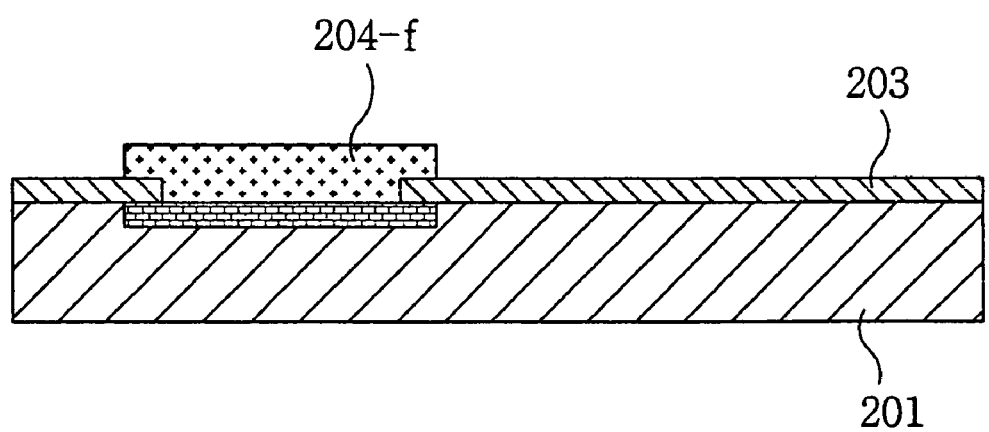
Figure 3G:
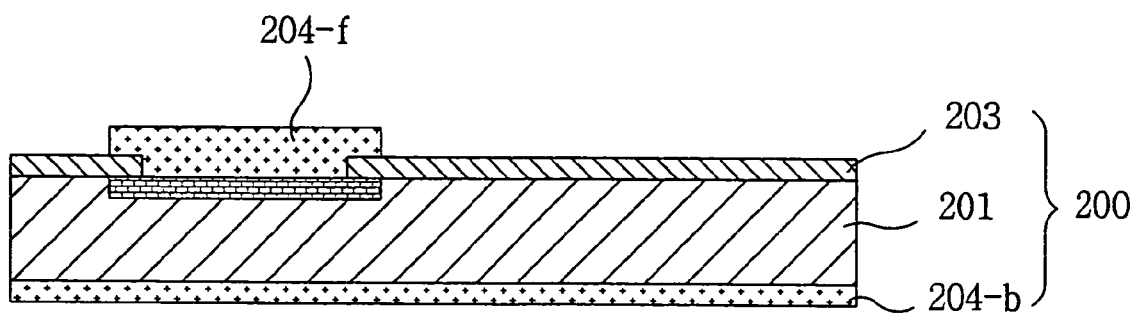
Figure 4A:
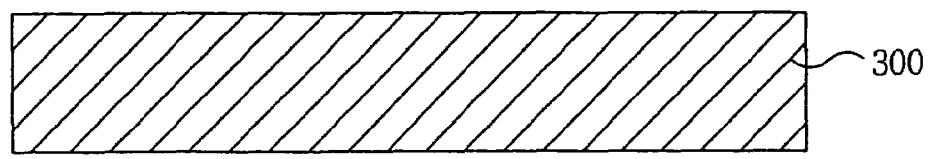
FIGS. 4a to 4g are cross-sectional views illustrating a method of fabricating a submount substrate for mounting a light emitting device according to a first embodiment of the present invention.
Figure 4B:
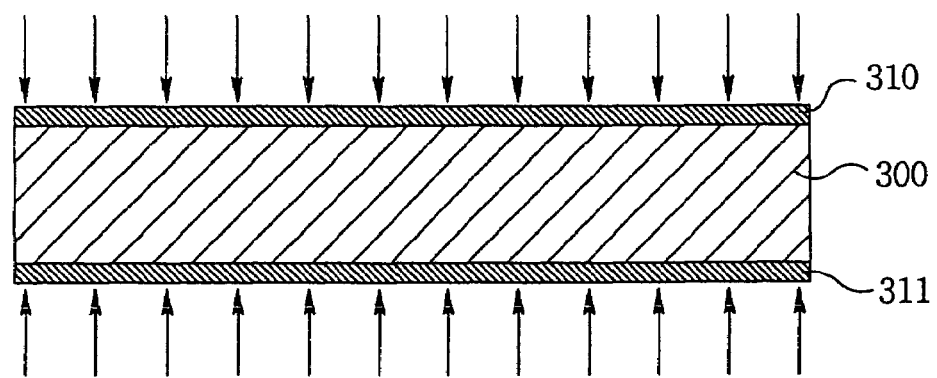
Figure 4C:
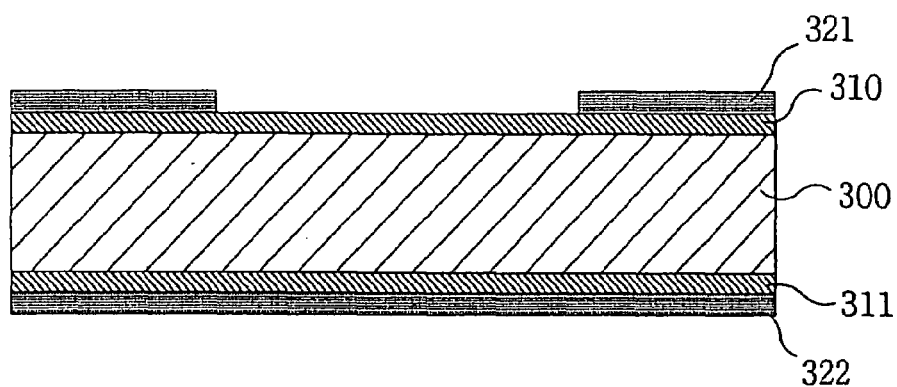

Referring to FIG. 4a, a substrate (300) doped with first polar impurities is first prepared.

Preferably, the substrate (300) is a silicon substrate.

Then, on the top and bottom surfaces of the substrate (300) are injected and diffused second impurities having the polarity different from that of the first polar impurities to form first and second diffusion layers (310, 311). (see FIG. 4b)

At this time, the second polar impurities can be injected and diffused into the top and bottom surfaces of the substrate (310) without using any diffusion mask.

Here, the first and second diffusion layers (310, 311) refer to layers that are diffused to a predetermined depth from the surfaces of the substrate (300).

Mask layers (321, 322) are then formed on the top and bottom surfaces of the substrate (300), respectively. Part of the mask layer (321) formed on the top surface of the substrate (300) is removed. (see FIG. 4c)

At this time, the mask layer (321) is partially removed to expose the first diffusion layer (310) to the outside.

If the substrate (300) is a silicon substrate, it is preferred a silicon nitride film be used as the mask layers (321, 322), and the partial removal of the mask layer (321) be carried out by the wet etching method.

Successively, the first diffusion layer (310), which has been exposed through the removal of the mask layer (321), and the substrate (300) placed below the first exposed diffusion layer are etched to form a groove (330). The mask layers (321, 322) are then removed. (see FIG. 4d)

Figure 4D:
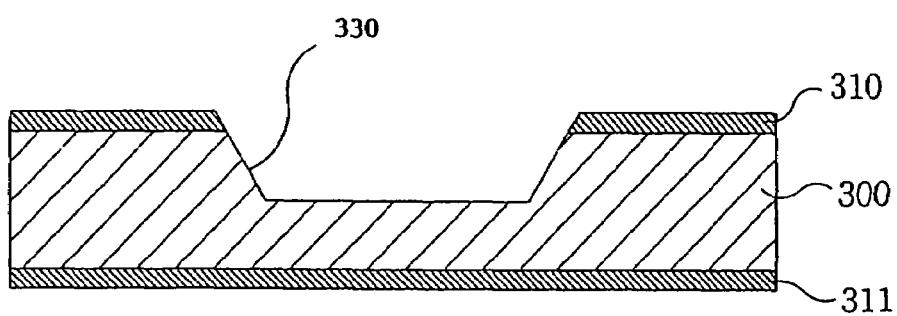
Figure 4E:
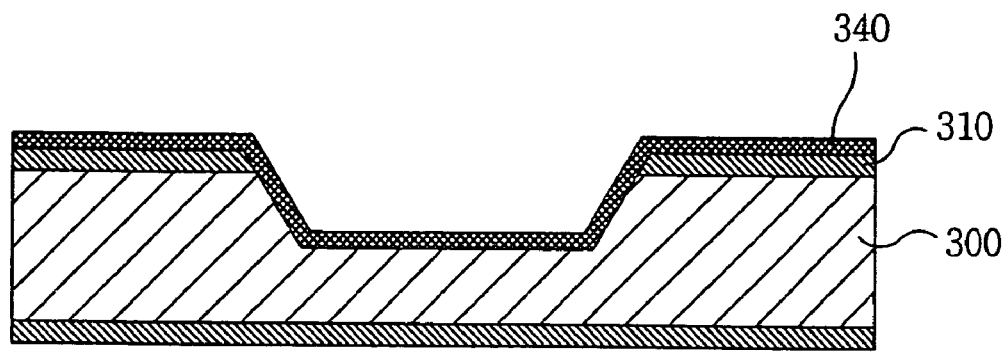
Figure 4F:
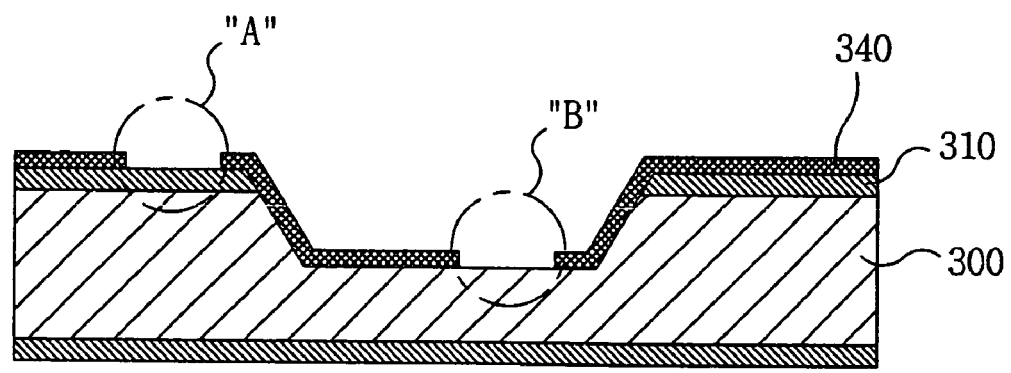
Figure 4G:
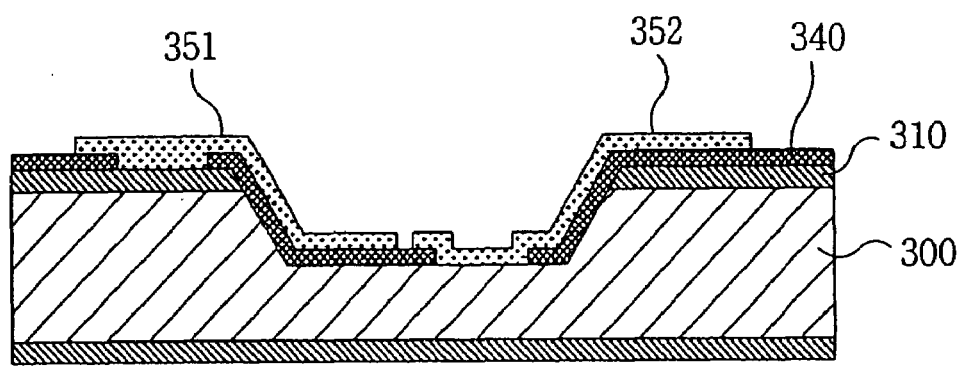

Here, the groove (330) is formed in such a manner that a wet etching plane shown in FIG. 4d can be obtained by performing anisotropic wet etching (by which the substrate is etched such that an etch rate of a [100] plane is high and an etch rate of a [111] plane is low if the substrate (300) is a silicon substrate) depending on a crystalline direction.

Preferably, an angle between the [100] plane and the [111] plane is 54.74 degrees. Further, the [111] plane thus formed can be used as a mirror surface for reflecting light emitted from a side surface of the light emitting device toward a front surface of the substrate.

An insulating layer (340) is then formed on the first exposed diffusion layer (310) and groove (330). (see FIG. 4e)

Further, the insulating layer (340) partially formed on the first diffusion layer (310) and the groove (330) is etched to form a first contact region (A) through which the first diffusion layer (310) is exposed and a second contact region (B) through which the substrate (300) is exposed. (see FIG. 4f)

Finally, a first electrode line (351) connected to the first diffusion layer (310) through the first contact region (A), and a second electrode line (352) connected to the substrate (300) through the second contact region (B) are formed. (see FIG. 4g)

In the submount substrate, thus configured, for mounting the light emitting device, the substrate (300) doped with the first polar impurities and the first diffusion layer (310) doped and diffused with the second polar impurities having the polarity different from that of the first polar impurities are constructed into a PN Zener diode.

Furthermore, electrodes of the light emitting device are bonded to the first and second electrode lines (351, 352) of the submount substrate such that the light emitting diode is flip-chip bonded to the submount substrate.

Figure 5:
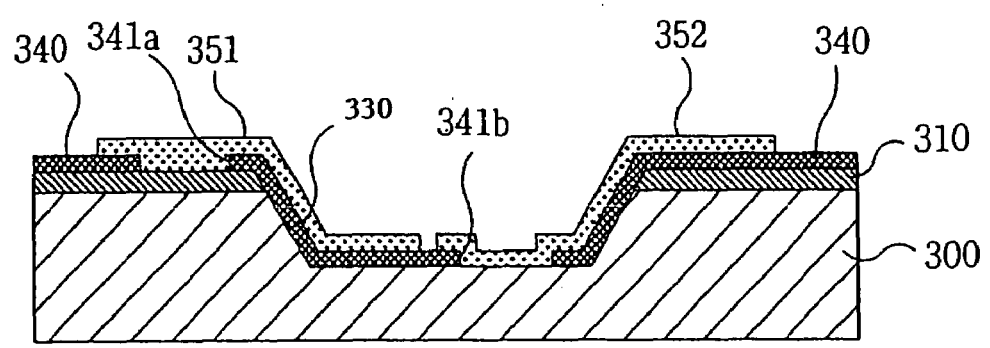
FIG. 5 is a cross-sectional view of the submount substrate for mounting the light emitting device according to the first embodiment of the present invention.

Referring now to FIG. 5, the submount substrate for mounting the light emitting device according to the first embodiment of the present invention includes the substrate (300) doped with the first polar impurities; the first diffusion layer (310) formed by causing the second polar impurities having the polarity different from that of the first polar impurities to be injected and diffused into the substrate (300) and then divided into two parts by means of a substrate region with no diffusion region formed thereon; the insulating layer (340) formed on a top surface of the substrate (300) and having a first opening (341a) through which part of one divided region of the first diffusion layer (310) is exposed and a second opening (341b) through which part of the substrate region with no diffusion region formed thereon is exposed; the first electrode line (351) formed on a top surface of the insulating layer (340) and connected to the first diffusion layer (310) through the first opening (341a); and the second electrode line (352) connected to the substrate region through the second opening (341b).

Preferably, the substrate region with no diffusion region formed thereon is constructed by the groove (330) formed by etching the substrate up to a predetermined depth.

The submount substrate is further comprised of the light emitting diode which is flip-chip bonded to the first and second electrode lines (351, 352).

Preferably, sidewalls of the groove (330) are inclined.

Still furthermore, if there is a height difference between an N-electrode and a P-electrode of the light emitting diode, the thickness of the insulating layer is determined by the height difference between the electrodes of the light emitting diode. Therefore, the light emitting diode can be bonded to the submount substrate without any inclination thereto to enable to improve bonding reliability.

If there is a height difference between the electrodes of the light emitting diode bonded to first and second electrode lines, the insulating layer is formed with a thickness corresponding to the height difference between the electrodes of the light emitting diode, so that the light emitting diode can be bonded to submount substrate in a horizontal equilibrium state.

Figure 6A:
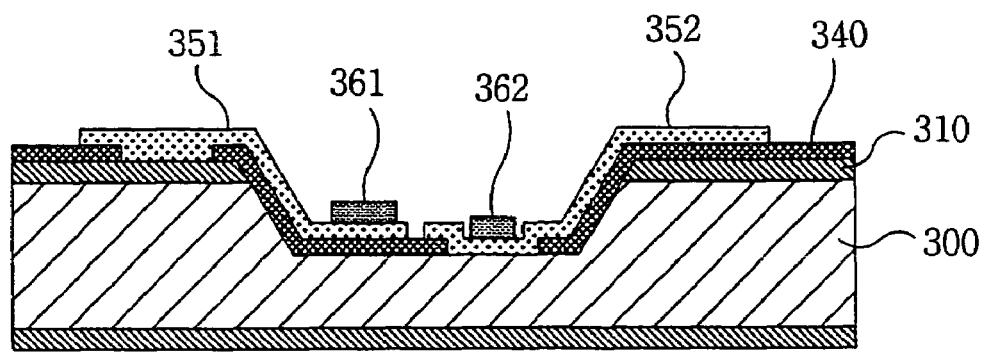
FIGS. 6a and 6b are cross-sectional views illustrating a process of mounting a light emitting diode to the submount substrate according to the first embodiment of the present invention.
Figure 6B:
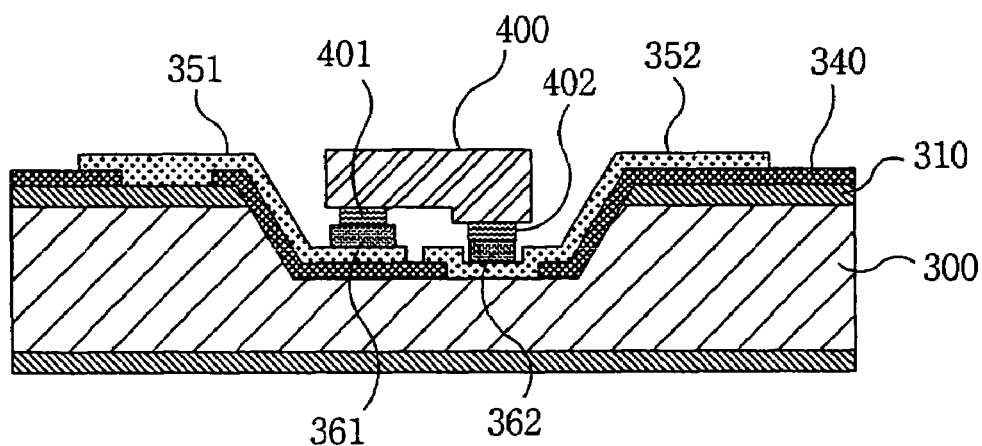
Figure 7A:
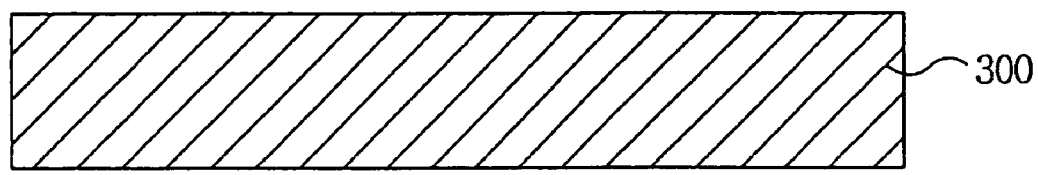
FIGS. 7a to 7i are cross-sectional views illustrating a method of fabricating a submount substrate for mounting a light emitting device in which a Zener diode having a bi-directional threshold voltage characteristic is integrated according to a second embodiment of the present invention.
Figure 7B:
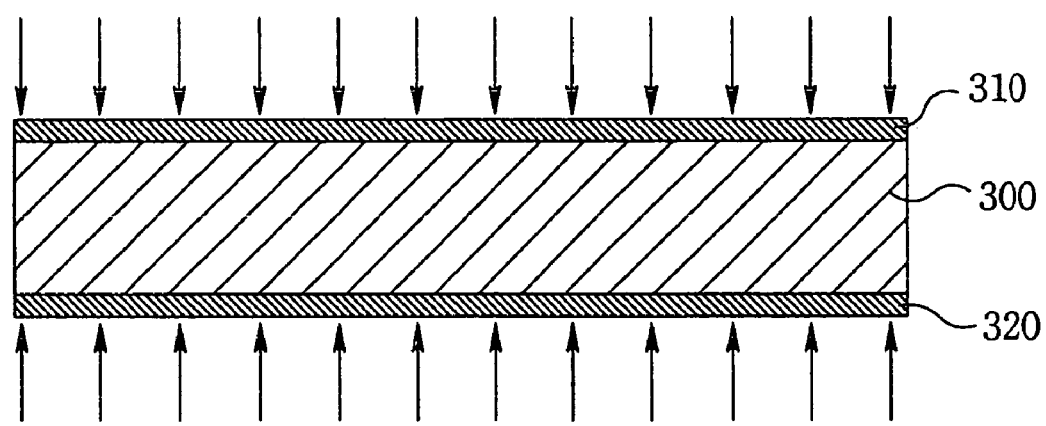
Figure 7C:
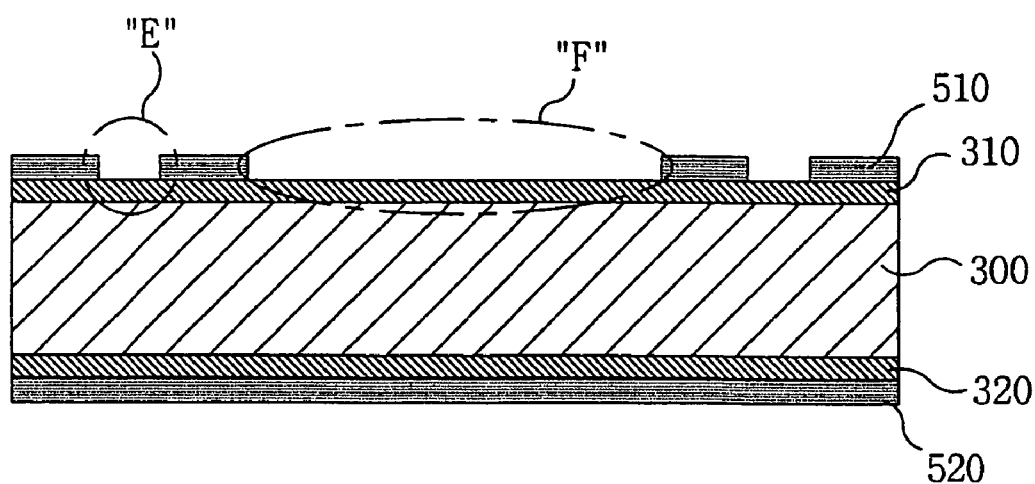
Figure 7D:
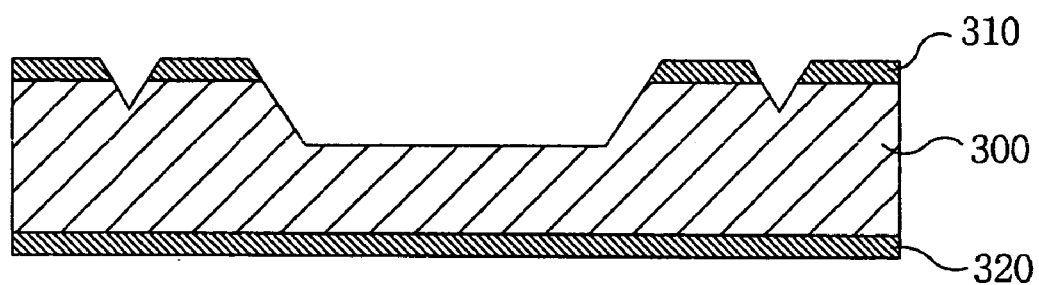
Figure 7E:
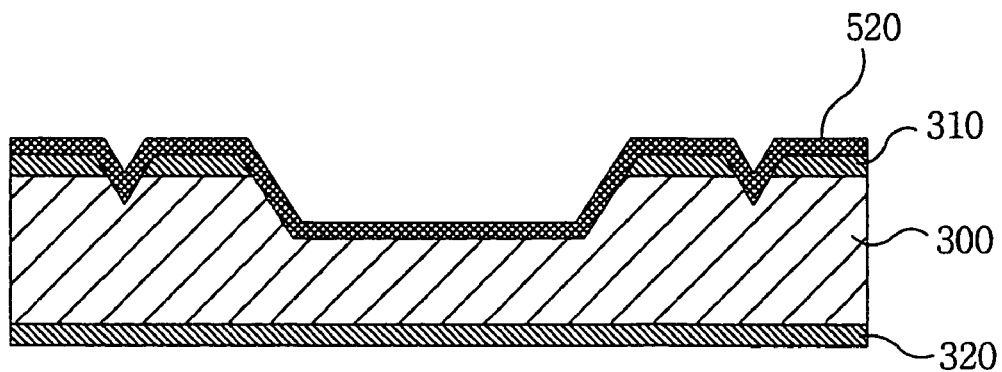
Figure 7F:
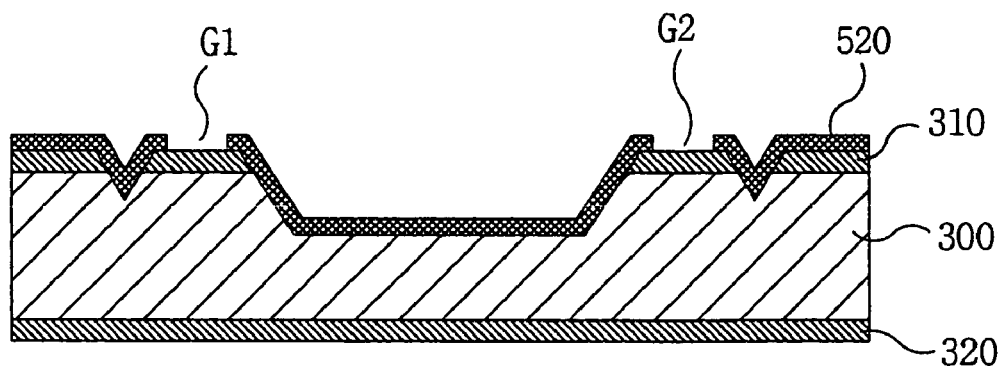
Figure 7G:
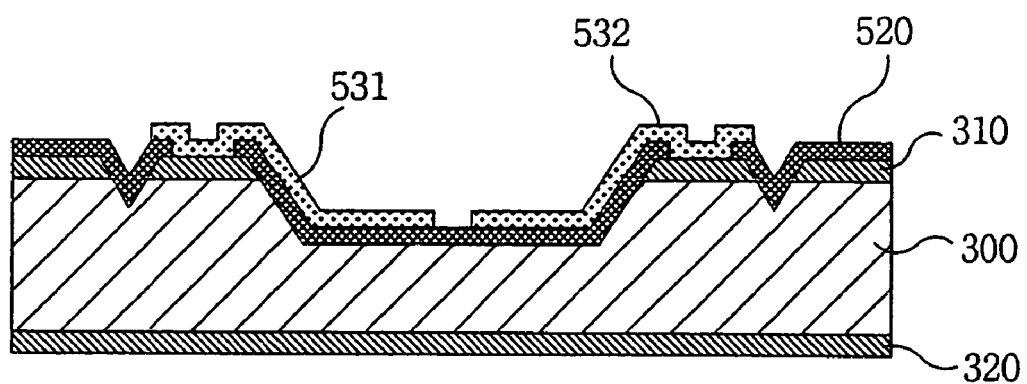
Figure 7H:
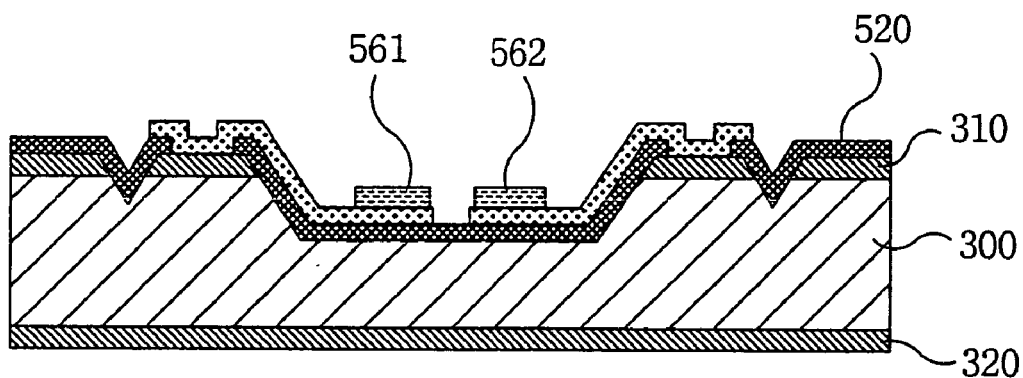
Figure 7I:
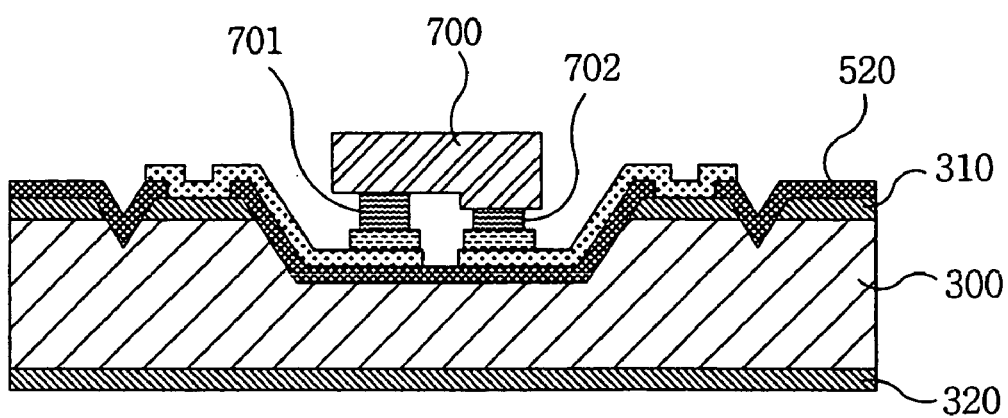

FIGS. 6a and 6b are cross-sectional views illustrating a process of mounting a light emitting diode to a submount substrate for mounting the light emitting device according to the first embodiment of the present invention. First, solder metal pads (361, 362) are formed on the first and second electrode lines (351, 352) of FIG. 4g, respectively. (see FIG. 6a)

Then, electrodes (401, 402) of the light emitting diode (400) are bonded on top surfaces of the solder metal pads (361, 362), respectively, by means of a flip-chip bonding process. (see FIG. 6b)

FIGS. 7a to 7i are cross-sectional views illustrating a method of fabricating a submount substrate for mounting a light emitting device in which a Zener diode having a bi-directional threshold voltage characteristic is integrated according to a second embodiment of the present invention. Herein, a PNP (or NPN) Zener diode is used as the Zener diode having the bidirectional threshold voltage characteristic.

First, a substrate (300) doped with first polar impurities is prepared. (see FIG. 7a)

Preferably, the substrate (300) is a silicon substrate.

Then, on the top and bottom surfaces of the substrate (300) are injected and diffused second impurities having the polarity different from that of the first polar impurities to form first and second diffusion layers (310, 320). (see FIG. 7b)

Successively, mask layers (510, 520) are formed on the top and bottom surfaces of the substrate (300), respectively. Some parts of the mask layer (510) formed on the top surface of the substrate (300) are removed to form a first region (a region "F") to which a light emitting diode is to be bonded, and second regions (regions "E") each of which is spaced apart from the first region in an opposite lateral direction of the substrate to separate the diffusion layer. (see FIG. 7c)

To this end, part of the mask layer (510) should be removed up to as much a depth as the diffusion layer can be etched to a certain degree to allow the diffusion layer to be separated.

After the first and second regions have been formed, the mask layer (510) is then removed.

Further, the first diffusion layer (310) and the substrate (300) in the first and second regions are etched. (see FIG. 7d)

Preferably, each second region is etched in the form of a V-cut groove.

Then, an insulating layer (520) is formed on the substrate (300) including the etched regions. (see FIG. 7e)

The insulating layer (520) is further etched between the first and second regions to form first and second contact regions (G1, G2) through which the first diffusion layer (310) is exposed. (see FIG. 7f)

Furthermore, a first electrode line (531) connected to the first diffusion layer (310) through the first contact region (G1) and a second electrode line (532) connected to the first diffusion layer (310) through the second contact region (G2) are then formed. (see FIG. 7g).

Finally, solder metal pads (561, 562) are formed on the first and second electrode lines (531, 532), respectively. Electrodes (701, 702) of a light emitting diode (700) are bonded to the solder metal pads (561, 562), respectively, by means of a flip-chip bonding process. (see FIGS. 7h and 7i)

Figure 8:
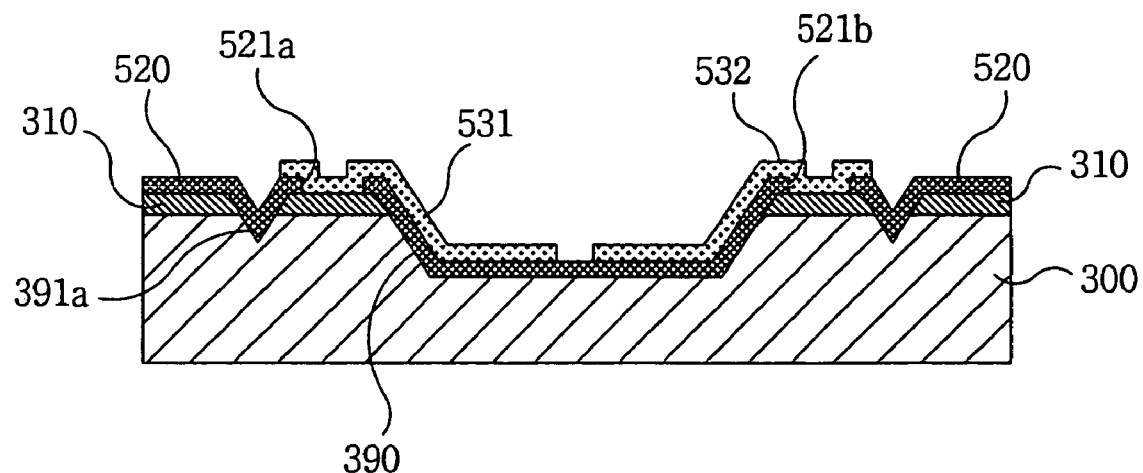
FIG. 8 is a cross-sectional view of the submount substrate for mounting the light emitting device according to the second embodiment of the present invention.

Referring to FIG. 8, the submount substrate for mounting the light emitting device according to the second embodiment of the present invention comprises the substrate (300) doped with the first polar impurities; the first diffusion layer (310) formed by causing the second polar impurities having the polarity different from that of the first polar impurities to be injected and diffused into the substrate (300) and formed on regions except for a first substrate region and a second substrate region, the first and second substrate regions being separately formed therebetween and having no diffusion regions thereon; the insulating layer (520) formed on a top surface of the substrate (300) and having the first and second openings (521a, 521b) through which the first diffusion layer (310) formed between the first and second regions is exposed; the first electrode line (531) formed on the insulating layer 520 and connected to the first diffusion layer through the first opening (521a); and the second electrode line (532) connected to the substrate region through the second opening (521b).

Preferably, the first and second regions with no diffusion region formed thereon are constructed by grooves (390, 391a, 391b) formed by etching the substrate up to a predetermined depth.

More preferably, the second regions are etched in the forms of V-cut grooves (391a, 391b).

Furthermore, the submount substrate for mounting the light emitting device further includes a light emitting diode that is flip-chip bonded to the first and second electrode lines (351, 352).

As described above, according to the present invention, since a submount substrate for mounting a light emitting device in which a Zener diode device is integrated can be fabricated by means of a silicon bulk micromachining process without using a diffusion mask, some processes related to the diffusion mask can be eliminated. Accordingly, there is an advantage in that the manufacturing costs can be reduced.

Furthermore, there is another advantage in that since a light emitting device can be flip-chip bonded directly to a submount substrate for a light emitting device in which a Zener diode device is integrated, a process of packaging the light emitting device and the voltage regulator device can be simplified.

Still furthermore, if there is a height difference between an N-electrode and a P-electrode of a light emitting diode, the thickness of an insulating layer can be determined by the height difference between the electrodes of the light emitting diode. Therefore, there is a further advantage in that since the light emitting diode can be bonded to the submount substrate without any inclination thereto, bonding reliability can be improved.

Although the present invention has been described and illustrated in connection with the preferred embodiments of the present invention, it is not limited thereto. It will be apparent to those skilled in the art that various modifications and changes may be made thereto without departing from the technical scope and spirit of the invention. Therefore, the true scope of the present invention should be defined by the technical spirit of the appended claims.

What is claimed is:

1. A method of fabricating a submount substrate for mounting a light emitting device, comprising the steps of:
   preparing a substrate doped with first polar impurities;
   injecting and diffusing second polar impurities having the polarity different from that of the first polar impurities into top and bottom surfaces of the substrate to form first and second diffusion layers;

forming a mask layer on the top surface of the substrate such that part of the first diffusion layer is exposed therethrough;

etching the exposed first diffusion layer and the substrate to form a groove, and then removing the mask layer;

forming an insulating layer on the groove and the first diffusion layer exposed by removing the mask layer therefrom;

etching the insulating layer formed on the first diffusion layer and the groove to form a first contact region through which the first diffusion layer is exposed and a second contact region through which the substrate is exposed; and forming a first electrode line connected to the first diffusion layer through the first contact region and a second electrode line connected to the substrate through the second contact region.

2. The method as claimed in claim 1, wherein the groove has inclined sidewalls.

3. The method as claimed in claim 1, wherein the substrate is a silicon substrate.

4. The method as claimed in claim 1, further comprising the step of flip-chip bonding a light emitting diode to the first and second electrode lines after forming the first and second electrode lines.

5. The method as claimed in claim 1, wherein the step of etching the exposed first diffusion layer and the substrate to form a groove is to perform a wet etching process to etch the first diffusion layer and a substrate region and to form a groove.

6. A method of fabricating a submount substrate for mounting a light emitting device, comprising the steps of:

preparing a substrate doped with first polar impurities;

injecting and diffusing second polar impurities having the polarity different from that of the first polar impurities into top and bottom surfaces of the substrate to form first and second diffusion layers;

forming mask layers, respectively, on the top and bottom surfaces of the substrate, removing parts of the mask layer formed on the top surface of the substrate to form a first region to which a light emitting diode is bonded and second regions each of which is spaced apart from the first region in an opposite lateral direction of the substrate to separate the diffusion layer, and then removing the mask layer formed on the top surface of the substrate;

etching the first diffusion layer and the substrate in the first and second regions;

forming an insulating layer on the substrate including the etched regions;

etching the insulating layer between the first and second regions to form first and second contact regions through which the first diffusion layer is exposed; and forming a first electrode line connected to the first diffusion layer through the first contact region and a second electrode line connected to the substrate through the second contact region.

7. The method as claimed in claim 6, wherein in the step of etching the first diffusion layer and the substrate in the first and second region, each second region is etched in the form of a V-cut groove.

8. The method as claimed in claim 6, wherein in the step of etching the first diffusion layer and the substrate in the first and second region, the first region is etched in the form of a groove whose sidewalls are inclined.

9. The method as claimed in claim 6, wherein the substrate is a silicon substrate.

10. The method as claimed in claim 6, further comprising the step of flip-chip bonding a light emitting diode to the first and second electrode lines after forming the first and second electrode lines.

* * * * *